United States Patent [19]

Itakura et al.

[11] Patent Number: 5,410,555

[45] Date of Patent: Apr. 25, 1995

[54] VITERBI DECODING APPARATUS

[75] Inventors: Eisaburo Itakura; Yuichi Kojima, both of Kanagawa, Japan

[73] Assignee: Sony Corporation, Tokyo, Japan

[21] Appl. No.: 972,924

[22] Filed: Nov. 6, 1992

[30] Foreign Application Priority Data

Nov. 15, 1991 [JP] Japan .................. 3-326665

[51] Int. Cl.⁶ .................. G06F 11/10; H03M 13/12
[52] U.S. Cl. .................. 371/43; 371/44; 371/45
[58] Field of Search .................. 371/43, 44, 45

[56] References Cited

U.S. PATENT DOCUMENTS

| 4,520,490 | 5/1985 | Wei | 371/43 |
| 4,730,322 | 3/1988 | Pollara-Bozzola | 371/43 |
| 5,117,427 | 5/1992 | Miyake et al. | 371/43 |

FOREIGN PATENT DOCUMENTS

| 0138598 | 4/1985 | European Pat. Off. |
| 0409205A2 | 1/1991 | European Pat. Off. |

OTHER PUBLICATIONS

Gerhard Fettweis ("High-Rate Viterbi Processor: A Systolic Array Solution" IEE Journal on Selected Areas in Communications, vol. 8, No. 8, Oct. 1990).
Patent Abstracts of Japan vol. 12, No. 452 (E-687) 28 Nov. 1988 & JP-A-63 178 626 (Fufitsu Limited) 22 Jul. 1988.
Patent Abstracts of Japan vol. 13, No. 323 (E-791) 21 Jul. 1989 & JP-A-10 89 878 (Sony Corp) 5 Apr. 1989.
Patent Abstracts of Japan vol. 14 No. 73 (E-887) 9 Feb. 1990 & JP-A-12 91 527 (Fufitsu Limited) 24 Nov. 1989.
Patent Abstracts Of Japan vol. 9, No. 10 (E-290) 17 Jan. 1985 & JP-A-59 160 349 (Fujitsu K.K.) 11 Sep. 1984.

Primary Examiner—Paul P. Gordon
Assistant Examiner—Emmanuel Moise
Attorney, Agent, or Firm—William S. Frommer; Alvin Sinderbrand

[57] ABSTRACT

A Viterbi decoding apparatus capable of decoding convolutional codes of 30 Mbps or more in information quantity for such applications as high-definition television broadcasting. The apparatus comprises a path memory circuit and an ACS.SM normalizing circuit. The path memory circuit is made of path memory cells arranged in matrix fashion for shifting a path decoded word in units of a plurality of time slots in accordance with a transition diagram corresponding to that plurality of time slots and on the basis of path selection signals from the ACS.SM circuit that calculates data in units of that plurality of time slots.

12 Claims, 10 Drawing Sheets

FIG. 10
PRIOR ART

VITERBI DECODING APPARATUS

BACKGROUND OF THE INVENTION

1. Field of the Invention

The present invention relates to a Viterbi decoding apparatus used typically in satellite broadcasting applications.

2. Description of the Prior Art

The Viterbi decoding method is known as one of the methods for decoding convolutional codes. More specifically, the Viterbi decoding method is a maximum likelihood decoding method that addresses convolutional codes. The method permits error correction by selecting the code stream most like the received code stream (called the maximum likelihood path) from among a plurality of code streams that may be generated by the encoder on the transmitting side.

The maximum likelihood path is selected not by comparison between all paths but by first obtaining the Hamming distance between the received code stream and each of all code streams that may be generated by the transmitting side. The maximum likelihood path to be selected is the path for which the accumulated Hamming distances are the smallest (i.e., likelihood is the highest). Once the maximum likelihood path is selected, only those paths that are necessary for decoding (called surviving paths) are examined in principle. If the path length is long enough, the tips (i.e., roots) of the surviving paths coincide with one another. That is, retrogressing to the root of any surviving path means eventually decoding the same value. Thus the correct word is decoded by examining the path length that is not so long as to raise the error rate of decoding and by retrogressing over that length up to that point in time whose data are taken as the target word.

FIG. 6 is a block diagram of a typical prior art Viterbi decoding apparatus operating on the above-described principle. The Viterbi decoding apparatus of FIG. 6 comprises a branch metric calculating circuit 101, an ACS circuit 102, a normalizing circuit 103, a state metric storing circuit 104, a path memory circuit 105 and a maximum likelihood path determining circuit 106. Upon receipt of data (input data) from the transmitting side, the apparatus selects the code stream most like the received code stream (called the maximum likelihood path) from among a plurality of code streams that may be generated by the encoder on the transmitting side. The apparatus then generates decoded data based on the selected code stream.

Given the input data, the branch metric calculating circuit 101 calculates the branch metric of the data and supplies the result of the calculation (i.e., branch metric) to the ACS circuit 102.

In addition to the branch metric from the branch metric calculating circuit 101, the ACS circuit 102 also receives a state metric (cumulative sum) coming from the state metric storing circuit 104. Based on these inputs and for every two paths converging on a certain state, the ACS circuit 102 adds the Hamming distance (branch metric) between the received code and each path and the cumulative sum (state metric) of past branch metrics for the path. The sums are compared between the two paths. The more likely path of the two is selected according to the result of the comparison. The result of the selection is fed to the path memory circuit 105, and the newly obtained cumulative sum (state metric) is supplied to the normalizing circuit 103.

If the constraint length for the above setup is 3, what happens is as follows: As shown in the transition diagram of FIG. 7, for every two paths converging on a certain state, the Hamming distance (branch metric) between the received code and each path and the cumulative sum (state metric) of past branch metrics for that path are added. The sums are compared between the two paths. The more likely path of the two is selected on the basis of the result of the comparison.

The normalizing circuit 103 normalizes the state metric output by the ACS circuit 102, bringing the state metric into a predetermined range. The normalized state metric is supplied to the state metric storing circuit 104.

On receiving the normalized state metric from the normalizing circuit 103, the state metric storing circuit 104 stores the state metric and feeds it back to the ACS circuit 102.

The path memory circuit 105 comprises a plurality of path memory cells 11011 through 1104n arranged in matrix fashion, as depicted in FIG. 8. Based on selection signals $PS_1$ through $PS_4$ from the ACS circuit 102, selecting circuits 111 select the input data. The result of the selection is temporarily retained by D-flip-flops 112 in synchronism with a clock signal CLK. In this manner, as shown in FIG. 9, the result of the selection from the ACS circuit 102 is stored and then forwarded to the maximum likelihood path determining circuit 106.

In turn, the maximum likelihood path determining circuit 106 determines the maximum likelihood path based on the result of the selection stored in the path memory circuit 105, as illustrated in FIG. 10. The circuit 106 then generates decoded data for output.

In the prior art Viterbi decoding apparatus described above, the state metric value from the preceding decoding process is added to that from the current decoding process through a loop made of parts ranging from the state metric storing circuit 104 to an adder, not shown, in the ACS circuit 102.

The operations inside the loop must be executed under a predetermined information rate. To raise the information rate requires minimizing the upper limit of the time it takes to pass through the loop.

The component that most affects the operation speed within this loop is the ACS circuit 102. This is because the ACS circuit 102, for every two paths converging on a certain state, adds the Hamming distance (branch metric) between the received code and each path and the cumulative sum (state metric) of past branch metrics for the path. The ACS circuit 102 then compares the sums between the two paths, and the more likely path thereof is selected according to the result of the comparison.

The prior art ACS circuit 102 for use in the above Viterbi decoding apparatus takes time $T_T$ when outputting the path selection signal that serves as path transition information for each time slot, as shown in FIG. 7. The time $T_T$ is given by the expression below.

$$T_T = T_A + T_C + T_S \qquad (1)$$

where, $T_A$ is the time for addition, $T_C$ is the time for comparison and $T_S$ is the time for selection.

At the same time, the increase in the information rate requires more strict accuracy of clock synchronization. This means that raising the information rate with the conventional circuit configuration kept unmodified can lead to various circuit operation problems. One such problem is an inappropriately shifted transition time. Another problem is the difficulty of clock control.

Furthermore, in the conventional setup, the upper limit of the operation speed is determined by the processing speed of the loop per time slot. If the constraint length is 7 and the coding rate is ½, the maximum operation speed is 25 Mbps in the current state of the art.

The constraint above makes it impossible to process large quantities of information amounting to as much as 30 Mbps, the mass of information being characteristic of high-definition television applications involving the decoding of convolutional codes.

SUMMARY OF THE INVENTION

It is therefore an object of the present invention to provide a Viterbi decoding apparatus capable of decoding convolutional codes of at least 30 Mbps in information quantity, the codes being typically used in high-definition television applications.

In carrying out the invention and according to one aspect thereof, there is provided a Viterbi decoding apparatus operating on the Viterbi decoding method for decoding input data, the Viterbi decoding apparatus comprising: an adder-comparator-selector (ACS) circuit made of circuit elements arranged in matrix fashion in units of a plurality of time slots for calculating data in units of the plurality of time slots; and a path memory circuit made of a plurality of path memory cells for shifting a path decoded word in units of the plurality of time slots in accordance with a transition diagram corresponding to the plurality of time slots and on the basis of a path selection signal from the ACS circuit.

According to another aspect of the invention, there is provided a Viterbi decoding apparatus operating on the Viterbi decoding method for decoding input data, the Viterbi decoding apparatus comprising: a branch metric calculating circuit supplied with a received signal; an adder-comparator-selector circuit (ACS) for accepting a branch metric as the result of calculations from the branch metric calculating circuit; a state metric normalizing circuit for normalizing a state metric output by the ACS circuit; a state metric storing circuit for storing the normalized state metric; a path memory circuit for accepting the input from the ACS circuit; and a maximum likelihood path determining circuit for accepting the output of the path memory circuit; wherein the ACS circuit supplies the path memory circuit with a path selection signal designating the maximum likelihood path selected from among a plurality of paths converging on a given state, the selection being performed by adding the branch metric and the state metric for each of the plurality of paths converging on the given state, the branch metric being a Hamming distance between a path and the received signal from the branch metric calculating circuit, the state metric being the cumulative sum of branch metrics from the state metric storing circuit, the sums from the adding being compared among the plurality of paths so that the maximum likelihood path will be selected; wherein the ACS circuit is made of circuit elements arranged in matrix fashion in units of a plurality of time slots for calculating data in units of the plurality of time slots; and wherein the path memory circuit is made of a plurality of path memory cells for shifting a path decoded word in units of the plurality of time slots in accordance with a transition diagram corresponding to the plurality of time slots and on the basis of the path selection signal from the ACS circuit.

In operation, the transition diagram corresponding to each unit of a plurality of time slots is referenced when the multiple path memory cells arranged in matrix fashion are operated in units of the plurality of time slots. The operation shifts the path decoded word in units of the plurality of time slots in accordance with the path selection signal from the ACS circuit that calculates data in units of the plurality of time slots. The scheme decodes convolutional codes of 30 Mbps or more in information quantity for use illustratively in high-definition television applications.

These and other objects, features and advantages of the invention will become more apparent upon a reading of the following description and appended drawings.

BRIEF DESCRIPTION OF THE DRAWINGS

Figure 10:
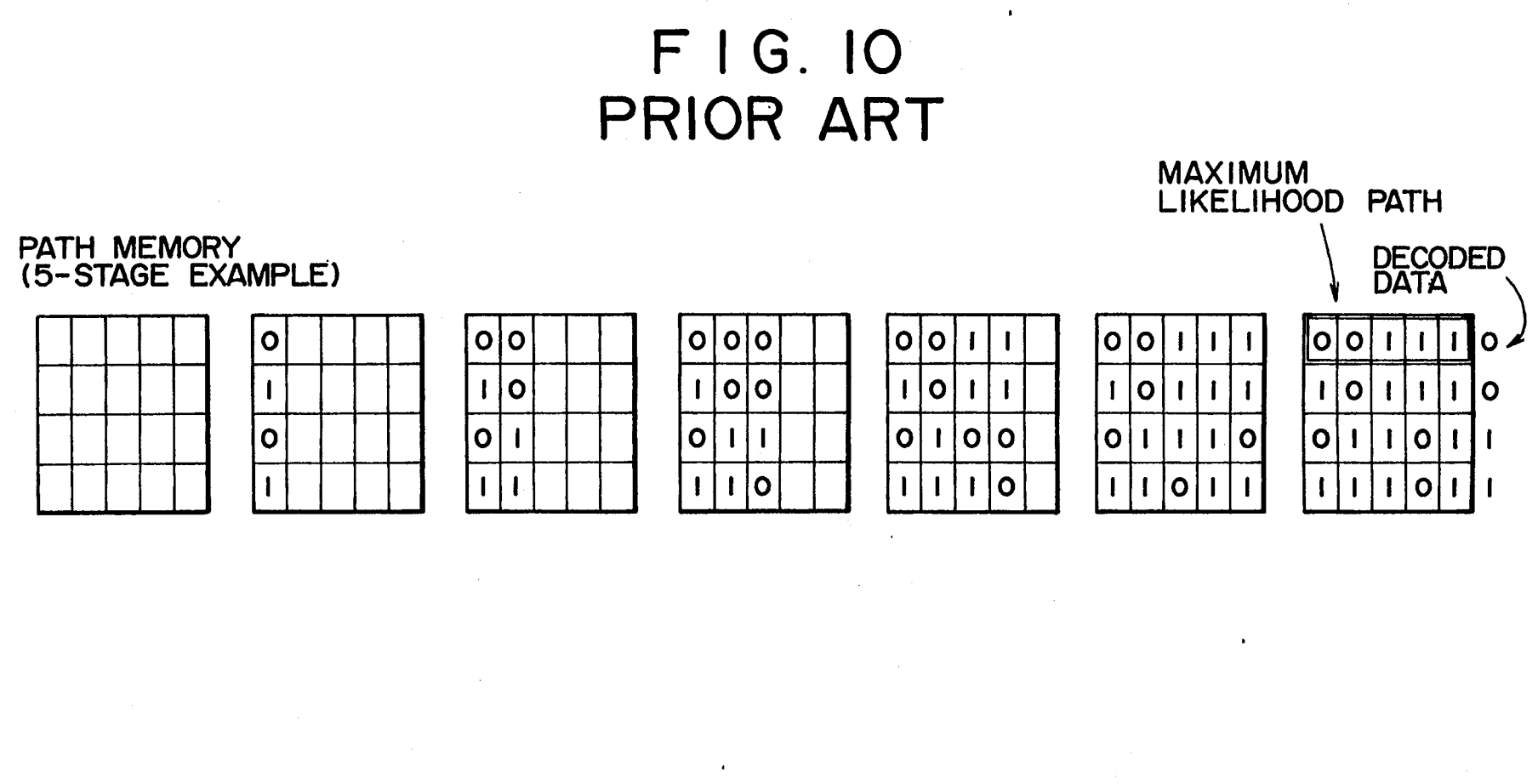

FIG. 10 is a schematic view illustrating typical decoded data obtained by the apparatus of FIG. 6.

DESCRIPTION OF THE PREFERRED EMBODIMENT

Prior to describing the present invention in detail, the basic operating principle thereof will be explained with reference to FIGS. 3 through 5.

Figure 7:
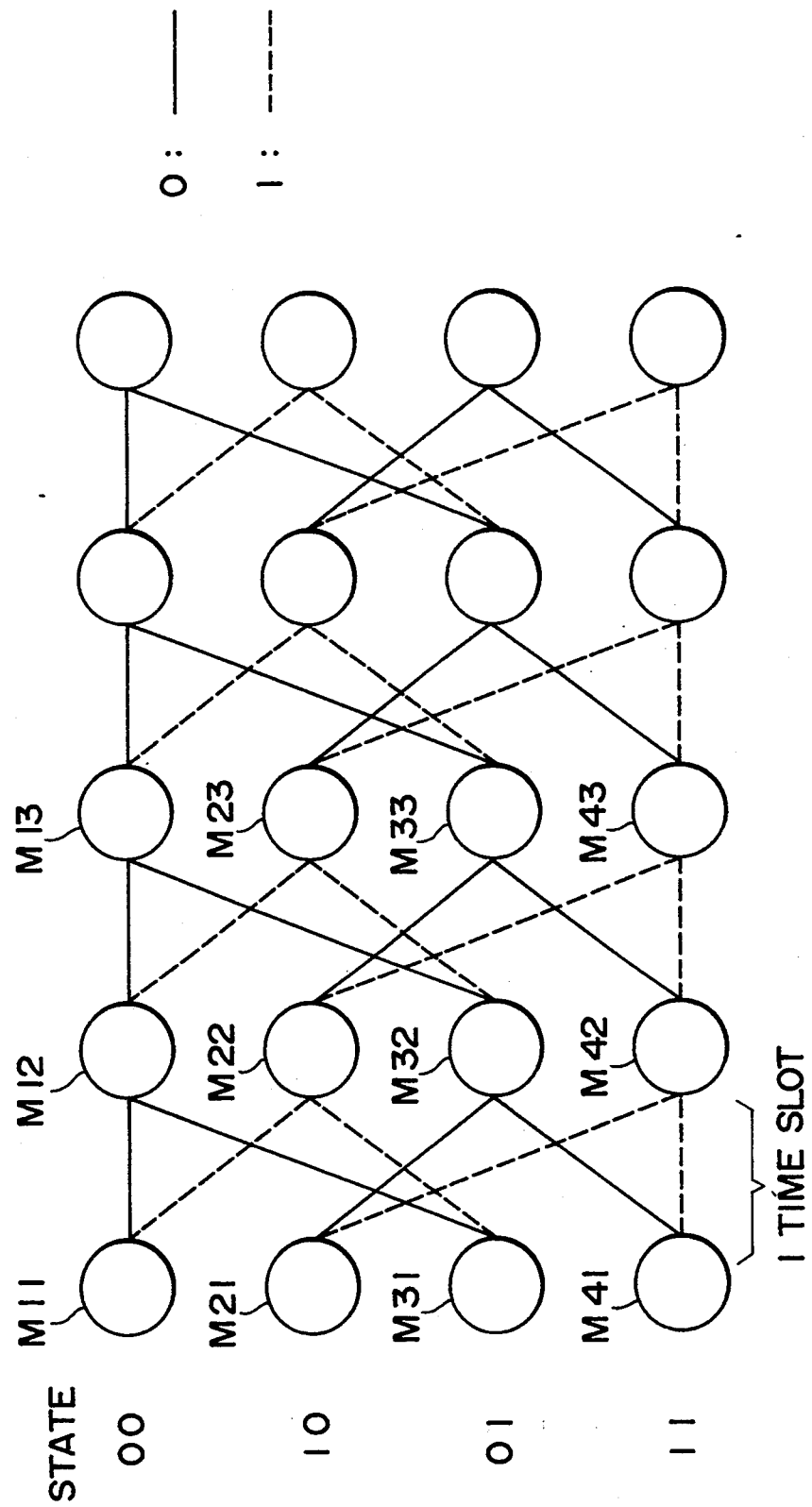
FIG. 7 is a transition diagram showing how an ACS circuit contained in the apparatus of FIG. 6 works.
Figure 8:
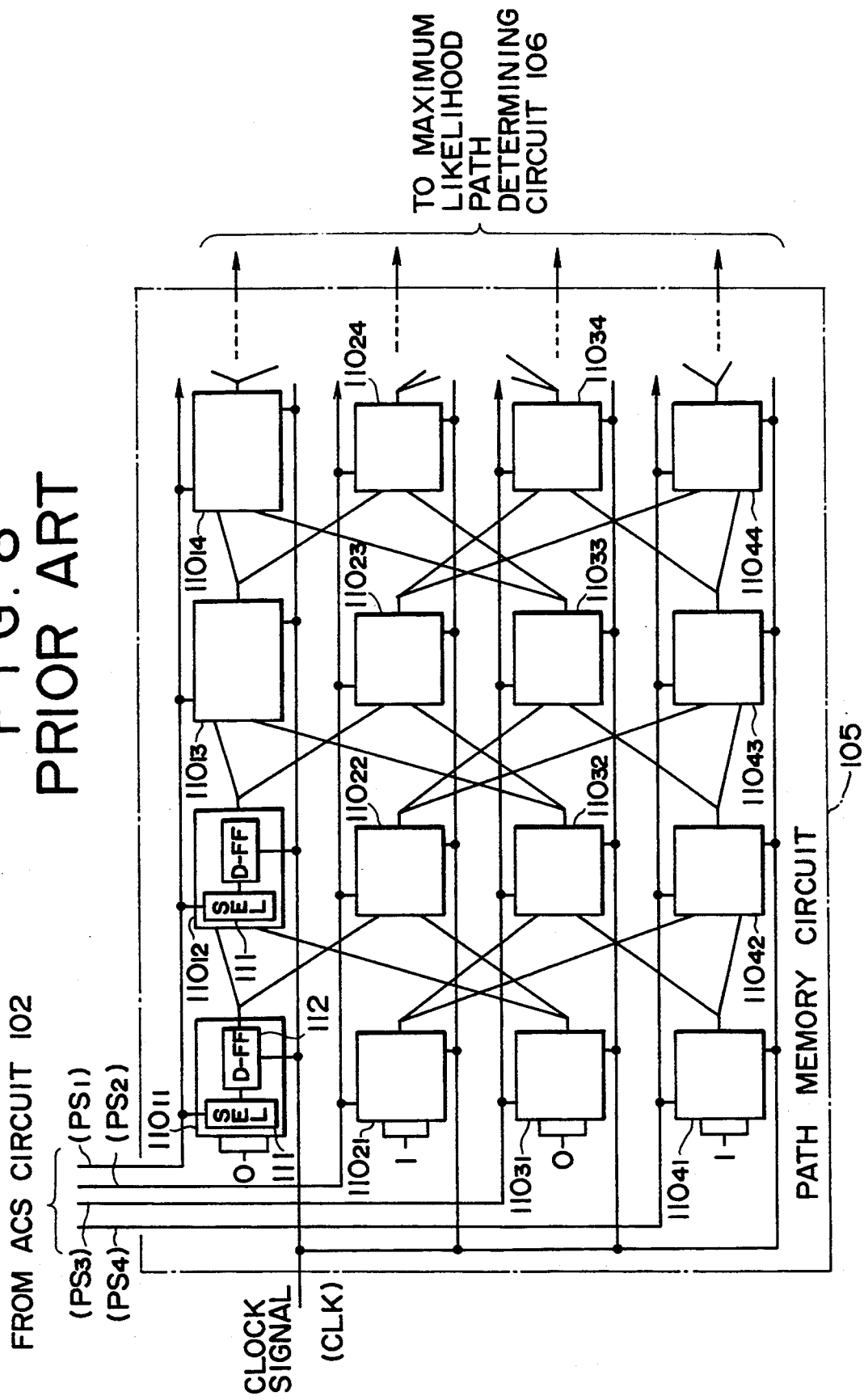
FIG. 8 is a block diagram of a path memory circuit included in the apparatus of FIG. 6.
Figure 9:
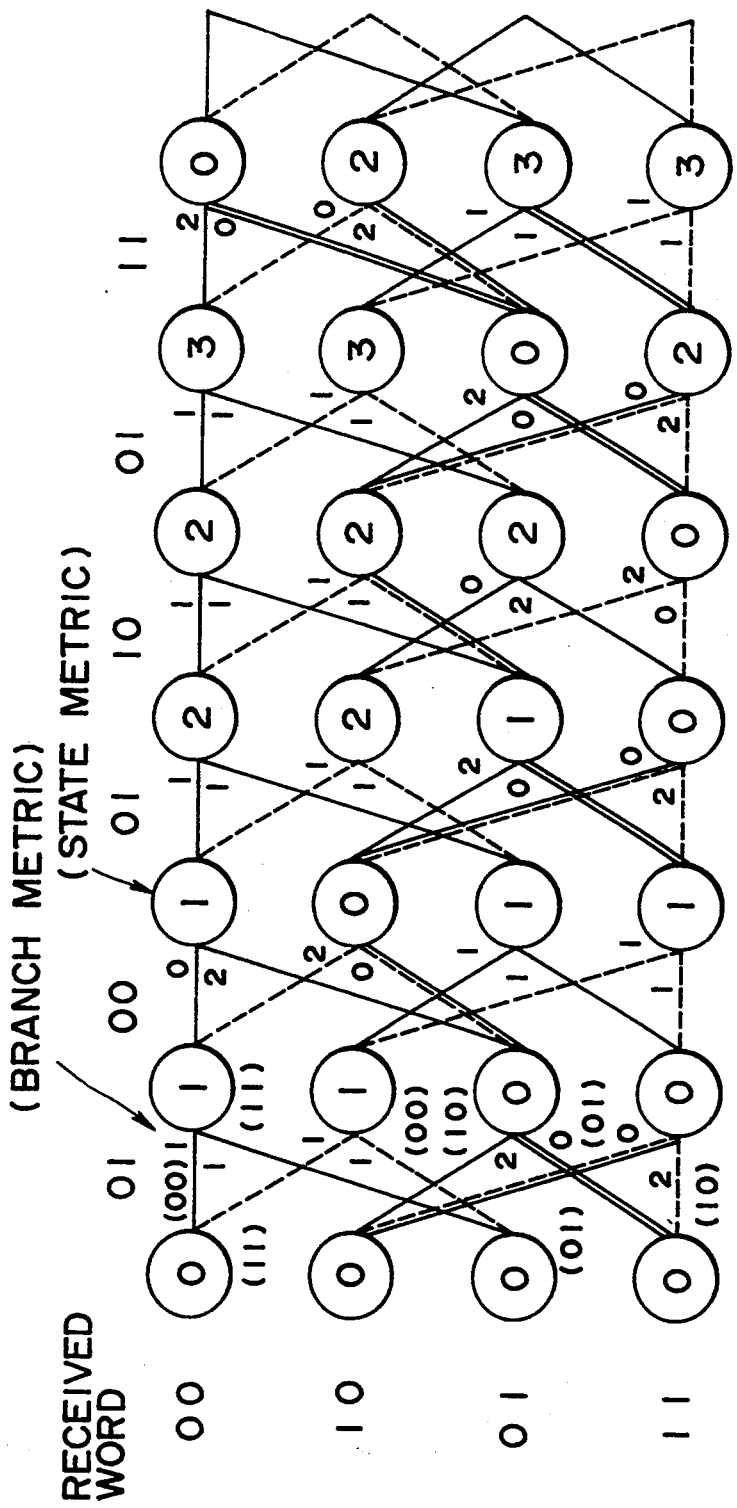
FIG. 9 is a schematic view describing how the ACS circuit in the apparatus of FIG. 6 works.

If the constraint length of input data is assumed to be 3, the operating principle of the prior art involves selecting one of the paths converging on each state node per time slot, the selected path having the shortest distance relative to the received code, as shown in FIG. 7. By contrast, the operating principle of the invention involves selecting one of the paths converging on each state node of every two time slots, the selected path having the shortest distance with respect to the received code, as depicted in FIG. 3. While the prior art scheme takes one time slot to add the state metric and branch metric, compare the sums and select the maximum likelihood path accordingly, the invention performs the same operations every two time slots. The processing time for every two time slots is given by the following expression:

$$T_T' = T_A' + T_C' + T_S' \qquad (2)$$

where, $T_A'$ is the time for addition, $T_C'$ is the time for comparison and $T_S'$ is the time for selection.

Figure 4:
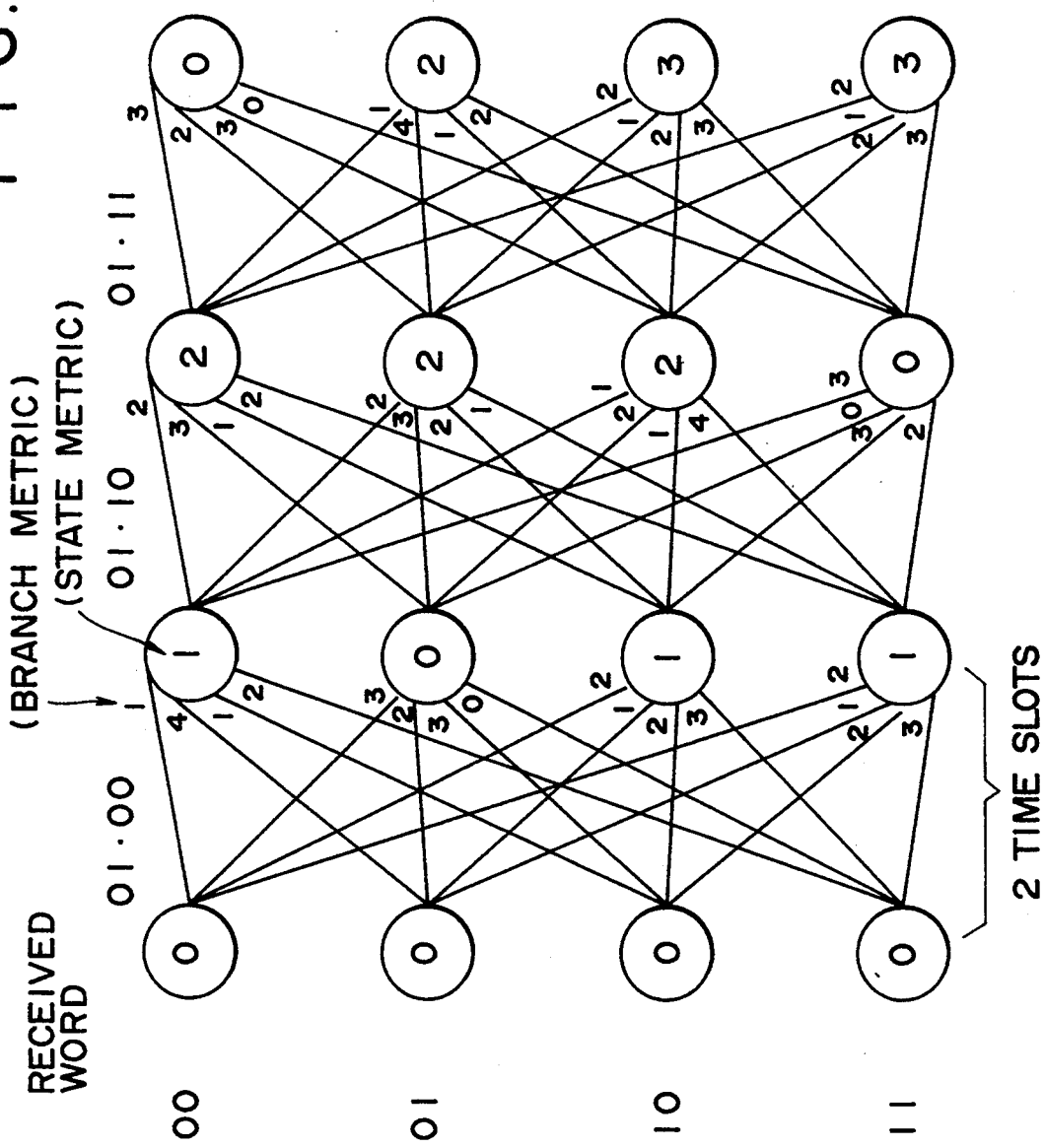
FIG. 4 is a schematic view showing how the embodiment works in principle.
Figure 5:
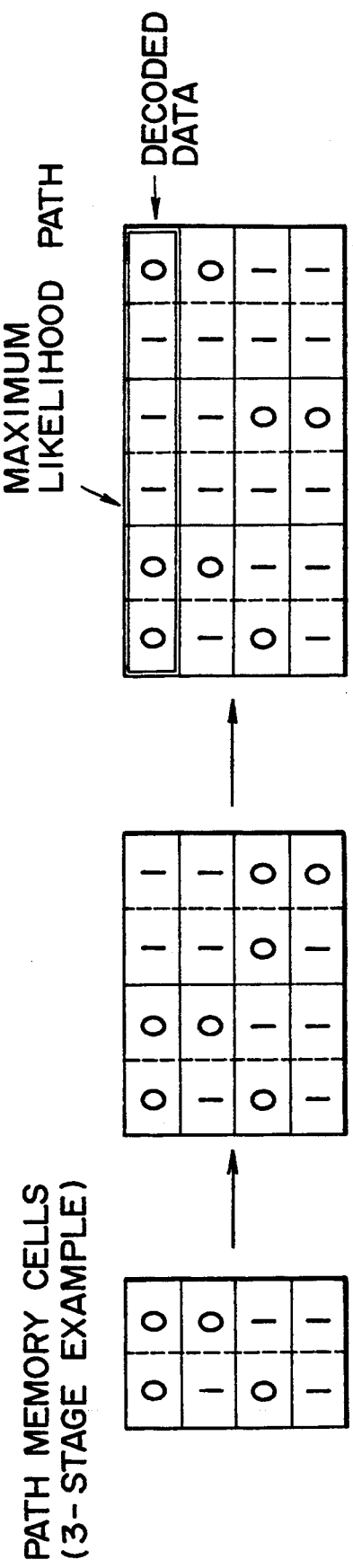
FIG. 5 is another schematic view depicting how the embodiment works in principle.
Figure 6:
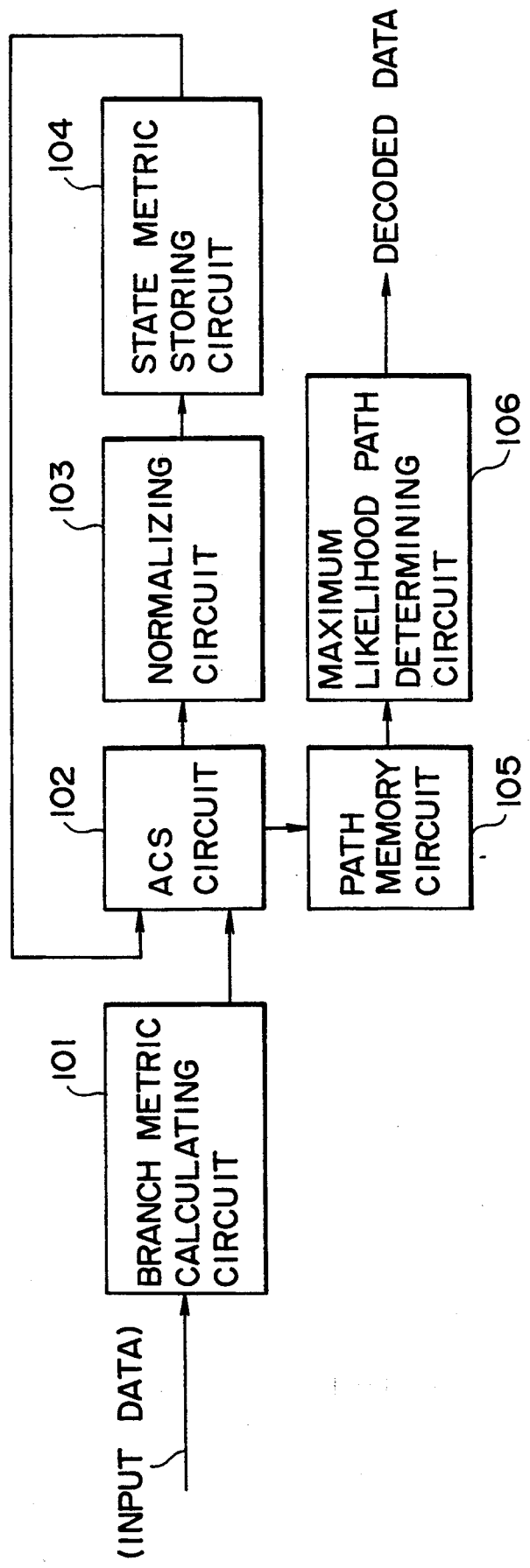
FIG. 6 is a block diagram of a typical prior art Viterbi decoding apparatus.

According to the invention, as illustrated in FIG. 4, transition occurs unchanged from four states to another four states. Even if the center state disappears, the result of shifting the decoded data of the path memory in units of two bits is the same as that of the prior art operation in each time slot, the decoded data being shifted by ACS calculations performed at intervals of two time slots according to a suitable two-time slot transition diagram. This is because the necessary information is only the decoded word value of the selected path along with its transition information. In this manner, the same decoded word as that from the prior art method is available according to the invention, as shown in FIG. 5.

The addition time $T_A'$, comparison time $T_C'$ and selection time $T_S'$ given in Expression (2) above become virtually the same as their counterparts of the prior art per time slot, as shown below, $$TA' \doteq TA$$

$$Tc' \doteq Tc$$

$$Ts' \doteq Ts \qquad (3)$$

While the prior art method takes the time of $2T_T$ to carry out processing for two time slots, the method according to the invention performs the same two-time slot processing in the time of $T_T$ which is about half the time required by the prior art method (provided $T_T'$, $\doteq T_T$).

Accordingly, the invention when embodied changes the path memory circuit configuration so as to store path selection information in units of two time slots. This ensures stable decoding at high speed.

Figure 1:
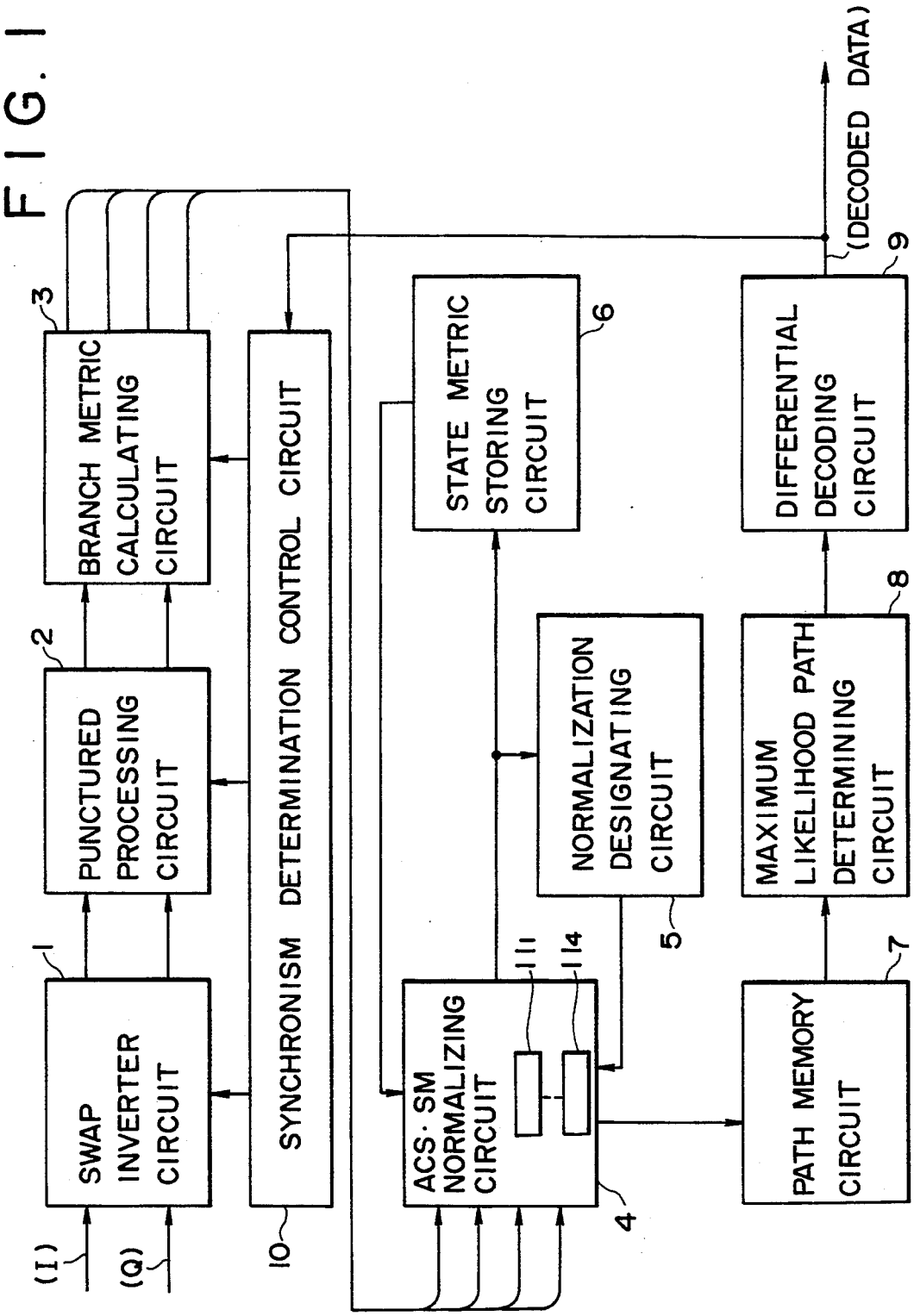
FIG. 1 is a block diagram of a Viterbi decoding apparatus embodying the invention.

FIG. 1 is a block diagram of a Viterbi decoding apparatus embodying the invention, the embodiment operating on the basic operating principle described above. The embodiment of FIG. 1 comprises a swap inverter circuit 1, a punctured processing circuit 2, a branch metric calculating circuit 3, an ACS.SM normalizing circuit 4, a normalization designating circuit 5, a state metric storing circuit 6, a path memory circuit 7, a maximum likelihood path determining circuit 8, a differential decoding circuit 9 and a synchronism determination control circuit 10. Given input data from the transmitting side, the embodiment selects the code stream most like the received code stream from among a plurality of code streams that may be generated by the encoder on the transmitting side. The embodiment then generates decoded data based on the result of the selection.

Upon receipt of a control command from the synchronism determination control circuit 10, the swap inverter circuit 1 accepts the input data and subjects the data to swap and inversion processing. The processed input data are fed to the punctured processing circuit 2.

In accordance with another control command from the synchronism determination control circuit 10, the punctured processing circuit 2 accepts the input data from the swap inverter circuit 1 and subjects the data to punctured processing. The processed input data are forwarded to the branch metric calculating circuit 3.

On receiving the input data from the punctured processing circuit 2, the branch metric calculating circuit 3 calculates the branch metric of the data and supplies the result (i.e., branch metric) to the ACS.SM normalizing circuit 4.

The ACS.SM normalizing circuit 4 comprises four unit processing circuits $11_1$ through $11_4$. Using the branch metric from the branch metric calculating circuit 3 and the state metric (cumulative sum) from the state metric storing circuit 6, the ACS.SM normalizing circuit 4 adds, for each of four paths converging on a given state, the Hamming distance (branch metric) between the received code and the path and the cumulative sum (state metric) of past branch metrics for that path. The sums are compared between the paths, and the maximum likelihood path thereof is selected. The result of the selection (selection signals PS'1–PS'4) is sent to the path memory circuit 7. If no normalization designating signal is output by the normalization designating circuit 5, the newly obtained cumulative sum (state metric) is supplied unchanged to both the normalization designating circuit 5 and the state metric storing circuit 6. If a normalization designating signal is output by the normalization designating circuit 5, the newly obtained state metric is normalized so that the value will fall within a predetermined range. The normalized state metric is sent to the normalization designating circuit 5 as well as to the state metric storing circuit 6.

When any one of the MSB's in the new state metrics output by the ACS.SM normalizing circuit 4 is 1, the normalization designating circuit 5 generates a normalization command after a predetermined number of time slots have elapsed. The command is then sent to the ACS.SM normalizing circuit 4.

The state metric storing circuit 6 stores state metrics supplied anew from the ACS.SM normalizing circuit 4 and returns each of the currently stored state metrics to the ACS.SM normalizing circuit 4.

Figure 2:
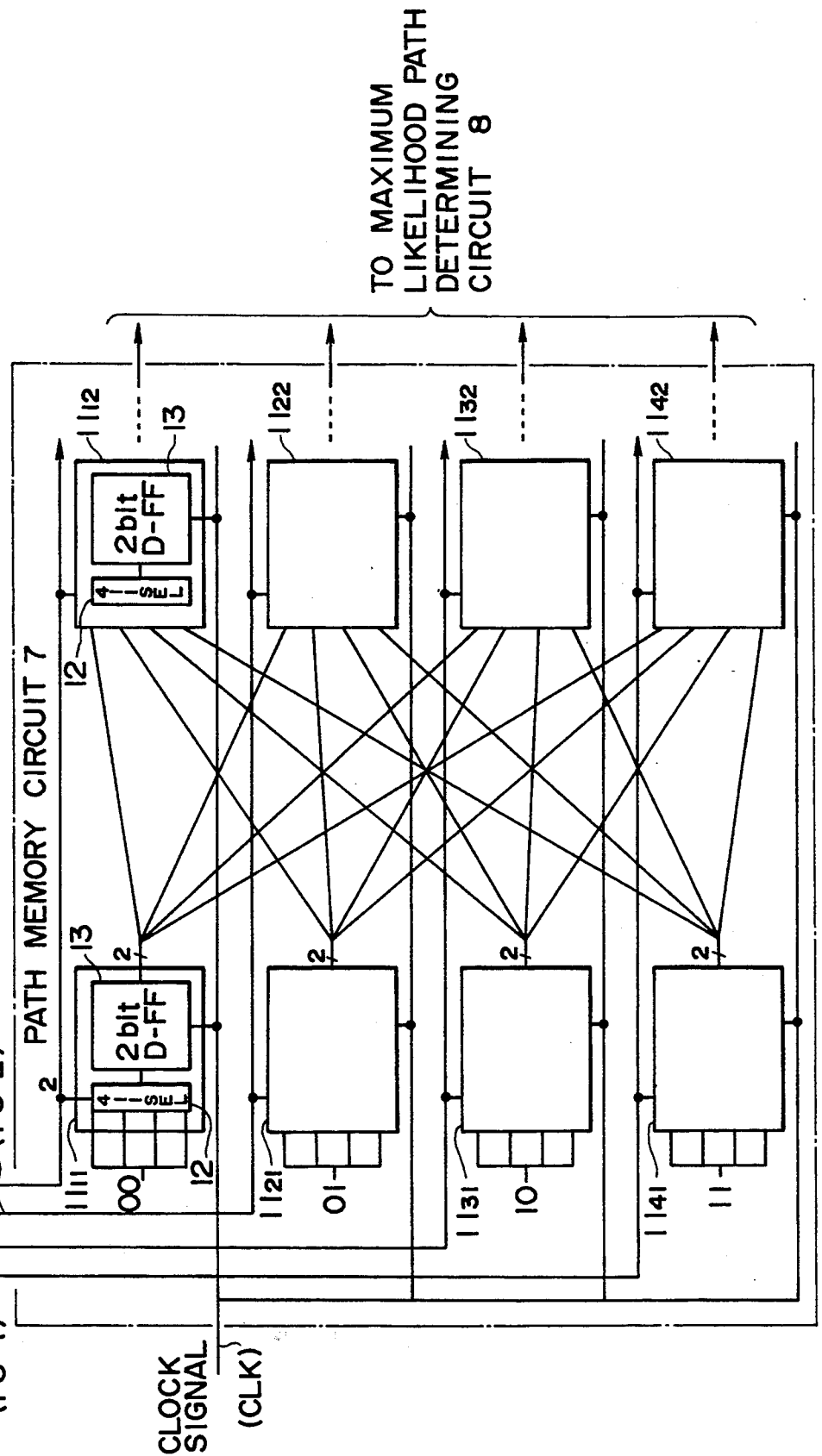
FIG. 2 is a block diagram showing a detailed construction of a path memory circuit contained in the embodiment of FIG. 1.
Figure 3:
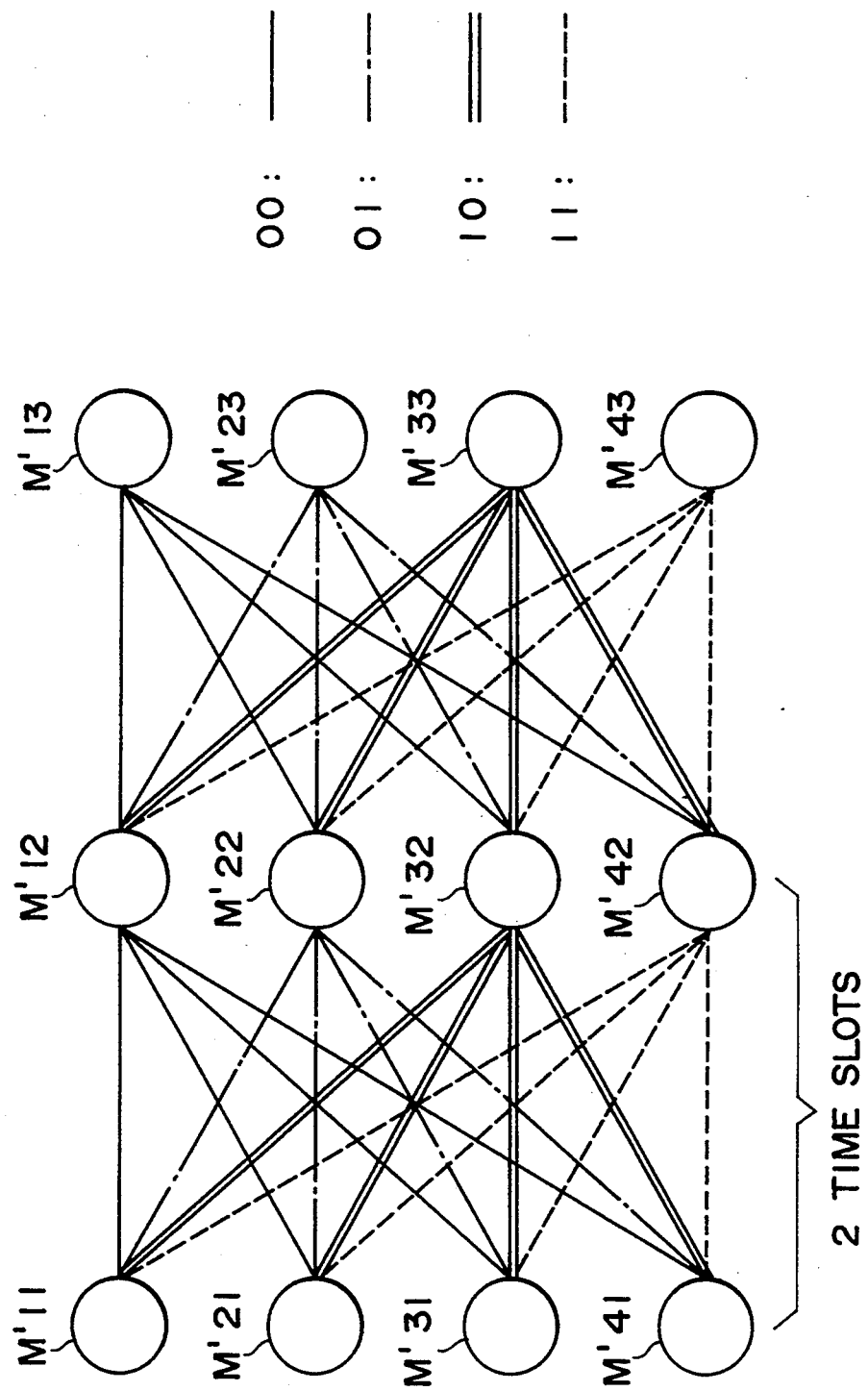
FIG. 3 is a transition diagram illustrating the basic operating principle of the embodiment.

The path memory circuit 7 comprises a plurality of path memory cells $11_{11}$ through $11_{4n}$ that are arranged in matrix fashion in units of two time slots as shown in FIG. 2 and are interconnected according to the diagram of FIG. 3. Upon receipt of selection signals PS'1 through PS'4 from the ACS.SM normalizing circuit 4, the path memory circuit 7 selects, temporarily stores and successively forwards the decoded word from one state to another until it reaches the maximum likelihood path determining circuit 8.

Each of the path memory cells $11_{11}$ through $11_{4n}$ comprises a selector circuit 12 and a two-bit D-flip-flop 13. The selector circuit 12 selects one of the four decoded words sent from the preceding stage in accordance with the selection signals PS'1 through PS'4 from the ACS.SM normalizing circuit 4. The D-flip-flop 13 accepts and stores a two-bit decoded word from the selector circuit 12 every time a clock signal CLK' is supplied. The selection signals PS'1 through PS'4 are output at intervals of two time slots by the ACS.SM normalizing circuit 4. Based on the selection signals, each selector circuit and each D-flip-flop selects and temporarily retains the decoded word coming from the preceding path memory cells, and sends the word to the next path memory cells to generate decoded words in units of two time slots. The decoded word eventually obtained is fed to the maximum likelihood path determination circuit 8.

The maximum likelihood path determining circuit 8 generates first decoded data by determining the maximum likelihood path based on the result of the selection stored in the path memory circuit 7. The first decoded data are supplied to the differential decoding circuit 9.

The differential decoding circuit 9 receives the first decoded data from the maximum likelihood path determining circuit 8 and generates second decoded data by subjecting the received data to differential decoding. The decoded data are output to downstream circuits and are supplied to the synchronism determination control circuit 10.

The synchronism determination control circuit 10 checks for synchronism the second decoded data coming from the differential decoding circuit 9. Based on the result of the check, the synchronism determination control circuit 10 controls the swap inverter 1 and punctured processing circuit 2 in synchronism.

As described, the embodiment performs ACS operations in units of two time slots while operating the path memory circuit 7 also in units of two time slots. This approximately reduces by half the time required conventionally to perform ACS calculations and to effect path memory processing in every time slot. The improved performance allows convolutional codes of 30 Mbps or more in information quantity to be properly decoded for such applications as high-definition television broadcasting.

With the above-described embodiment, state transition takes place in units of two time slots when the constraint length of input data is 3. Alternatively, state transition may be arranged to occur in units of n time slots so that the decoded word will be shifted in units of n bits.

Where the constraint length is K for the above alternative, calculations may be carried out in units of up to K−1 time slots. For a given state, it is sufficient to calculate transition from among 2K−1 states that are in effect K−1 time slots earlier. That is, the maximum likelihood path is selected from among the 2K−1 paths. This further reduces the calculation time.

As described, the Viterbi decoding apparatus according to the invention is capable of decoding convolutional codes of 30 Mbps or more in information quantity for such applications as high-definition television broadcasting.

As many apparently different embodiments of this invention may be made without departing from the spirit and scope thereof, it is to be understood that the invention is not limited to the specific embodiments thereof except as defined in the appended claims.

What is claimed is:

1. A Viterbi decoding apparatus operating according to the Viterbi decoding method for decoding input data, said Viterbi decoding apparatus comprising:
adder-comparator-selector means including circuit elements arranged in matrix fashion and operating in units of a plurality of time slots for producing at least one path selection signal; and
path memory means including a plurality of path memory cells for shifting a path decoded word and operative in said units of said plurality of time slots in accordance with said at least one path selection signal and a transition diagram having state nodes and state transitions corresponding to said plurality of time slots 2. A Viterbi decoding apparatus according to claim 1, wherein said adder-comparator-selector means is operative to select, at each of said units of said plurality of time slots, the one of paths converging on each state node for which the distance to a received code is minimum.

3. A Viterbi decoding apparatus according to claim 2, wherein said received code represents a high-definition television signal.

4. A Viterbi decoding apparatus according to claim 1, wherein each of said path memory cells comprises a selector and storage for a plurality of bits.

5. A Viterbi decoding apparatus according to claim 4, wherein the cardinality of said plurality of bits is equal to the cardinality of said plurality of time slots.

6. A Viterbi decoding apparatus operating according to the Viterbi decoding method for decoding input data, said Viterbi decoding apparatus comprising:
branch metric calculating means for calculating Hamming distances between a received signal and each of the possible paths converging on a given state, and for supplying said Hamming distances as branch metrics;
adder-comparator-selector means for respectively adding said branch metrics and a cumulative sum of branch metrics, for comparing the sums resulting from said adding, for selecting a path as a function of the comparison, for producing a path selection signal designating the selected path, and for producing a state metric as a function of the comparison, said adder-comparator-selector means including circuit elements arranged in matrix fashion and operating in units of a plurality of time slots;
state metric normalizing means for normalizing said state metric;
state metric storing means for storing the normalized state metric as said cumulative sum of branch metrics; and
path memory means including a plurality of path memory cells for selecting a decoded word as a function of said path selection signal and a transition diagram having state nodes and state transitions corresponding to said plurality of time slots, for storing said decoded word and for shifting said decoded word in said units of said plurality of time slots.

7. A Viterbi decoding apparatus according to claim 6, further comprising maximum likelihood path determining means for determining a maximum likelihood path based on selected contents of said path memory means and for generating first decoded data based on the maximum likelihood path.

8. A Viterbi decoding apparatus according to claim 7, further comprising differential decoding means for performing differential decoding on said first decoded data to generate second decoded data.

9. A Viterbi decoding apparatus according to claim 8, further comprising synchronism control means for checking the synchronism of said second decoded data and for controlling the synchronization of said received signal supplied to said branch metric calculating means in accordance with the synchronism check of said second decoded data.

10. A Viterbi decoding apparatus according to claim 6, wherein said state metric normalizing means includes a plurality of unit processing circuits.

11. A Viterbi decoding apparatus according to claim 6, wherein said received signal is a high-definition television signal.

12. A Viterbi decoding apparatus according to claim 6, wherein each of said path memory cells comprises a selector and storage for a plurality of bits.

* * * * *